(12) United States Patent
Okunaga

(10) Patent No.: US 12,040,773 B2
(45) Date of Patent: Jul. 16, 2024

(54) ACOUSTIC WAVE DEVICE

(71) Applicant: Murata Manufacturing Co., Ltd., Nagaokakyo (JP)

(72) Inventor: Hiromu Okunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 453 days.

(21) Appl. No.: 17/471,265

(22) Filed: Sep. 10, 2021

(65) Prior Publication Data

US 2021/0408995 A1 Dec. 30, 2021

Related U.S. Application Data

(63) Continuation of application No. PCT/JP2020/009800, filed on Mar. 6, 2020.

(30) Foreign Application Priority Data

Mar. 13, 2019 (JP) ................. 2019-045880

(51) Int. Cl.
*H03H 9/02* (2006.01)

(52) U.S. Cl.
CPC .... *H03H 9/02015* (2013.01); *H03H 9/02228* (2013.01)

(58) Field of Classification Search
CPC ........................ H03H 9/02015; H03H 9/02228
See application file for complete search history.

(56) References Cited

U.S. PATENT DOCUMENTS

| 2013/0051588 A1 | 2/2013 | Ruile et al. |
| 2013/0249647 A1 | 9/2013 | Nakanishi et al. |
| 2016/0087187 A1* | 3/2016 | Burak ............... H03H 9/173 |
| | | 310/366 |
| 2016/0352304 A1* | 12/2016 | Kadota .............. H03H 9/02228 |
| 2017/0358730 A1 | 12/2017 | Kishimoto et al. |
| 2018/0085787 A1* | 3/2018 | Burak ............... H03H 9/02118 |
| 2019/0334500 A1 | 10/2019 | Horikawa |
| 2019/0356296 A1 | 11/2019 | Mimura |
| 2020/0036357 A1 | 1/2020 | Mimura |

FOREIGN PATENT DOCUMENTS

| JP | 2015-111923 A | 6/2015 |
| JP | 2017-224890 A | 12/2017 |
| WO | 2011/088904 A1 | 7/2011 |
| WO | 2016/047255 A1 | 3/2016 |
| WO | 2018/131454 A1 | 7/2018 |
| WO | 2018/146910 A1 | 8/2018 |
| WO | 2018/198654 A1 | 11/2018 |
| WO | 2018/235605 A1 | 12/2018 |

OTHER PUBLICATIONS

Official Communication issued in International Patent Application No. PCT/JP2020/009800, mailed on Jun. 2, 2020.
Official Communication issued in corresponding Japanese Patent Application No. 2021-505042, mailed on Oct. 26, 2021.

* cited by examiner

*Primary Examiner* — Samuel S Outten
(74) *Attorney, Agent, or Firm* — Keating & Bennett, LLP

(57) ABSTRACT

An acoustic wave device includes an energy confinement layer, a piezoelectric film, and an IDT electrode laminated on a support substrate. Acoustic velocity adjustment films are at least partially provided between the piezoelectric film and the support substrate and are made of a material different from that of the piezoelectric film.

19 Claims, 6 Drawing Sheets

ACOUSTIC WAVE DEVICE

CROSS REFERENCE TO RELATED APPLICATIONS

This application claims the benefit of priority to Japanese Patent Application No. 2019-045880 filed on Mar. 13, 2019 and is a Continuation Application of PCT Application No. PCT/JP2020/009800 filed on Mar. 6, 2020. The entire contents of each application are hereby incorporated herein by reference.

BACKGROUND OF THE INVENTION

1. Field of the Invention

The present invention relates to an acoustic wave device including an acoustic velocity adjustment film.

2. Description of the Related Art

A known acoustic wave device includes an acoustic velocity adjustment film for partially differentiating an acoustic velocity of an acoustic wave. For example, in an acoustic wave device described in WO2011/088904A1, first and second edge regions are provided in the vicinity of both ends of an overlap region in which a first electrode finger and a second electrode finger overlap with each other when viewed in an acoustic wave propagation direction. In order to reduce the acoustic velocity in the first and second edge regions, a metal film for adding mass is laminated on the first and second electrode fingers in the first and second edge regions. Further, Japanese Unexamined Patent Application Publication No. 2015-111923 discloses a structure in which a dielectric film is laminated on first and second electrode fingers in edge regions.

In the acoustic wave device described in WO2011/088904A1 or Japanese Unexamined Patent Application Publication No. 2015-111923, it is difficult to form the acoustic velocity adjustment film with high accuracy since the acoustic velocity adjustment film made of metal or dielectric is laminated on the first and second electrode fingers. Accordingly, it is difficult to adjust the acoustic velocity with high accuracy. Further, laminating a relatively thick acoustic velocity adjustment film on the electrode finger increases an acoustic loss. Accordingly, an electromechanical coupling coefficient and Q characteristics may deteriorate.

SUMMARY OF THE INVENTION

Preferred embodiments of the present invention provide acoustic wave devices that are each able to adjust an acoustic velocity with high accuracy and unlikely to cause acoustic loss.

An acoustic wave device according to a preferred embodiment of the present invention includes a support substrate, a piezoelectric film, an IDT electrode on the piezoelectric film, an energy confinement layer between the piezoelectric film and the support substrate to confine energy in the piezoelectric film, and an acoustic velocity adjustment film at least partially between the piezoelectric film and the support substrate and made of a material different from that of the piezoelectric film.

According to preferred embodiments of the present invention, it is possible to provide acoustic wave devices that are each able to adjust an acoustic velocity with high accuracy and unlikely to cause acoustic loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

The preferred embodiments described in the present description are exemplary, and partial replacement or combination of structures and configurations is possible between different preferred embodiments.

Figure 1A:
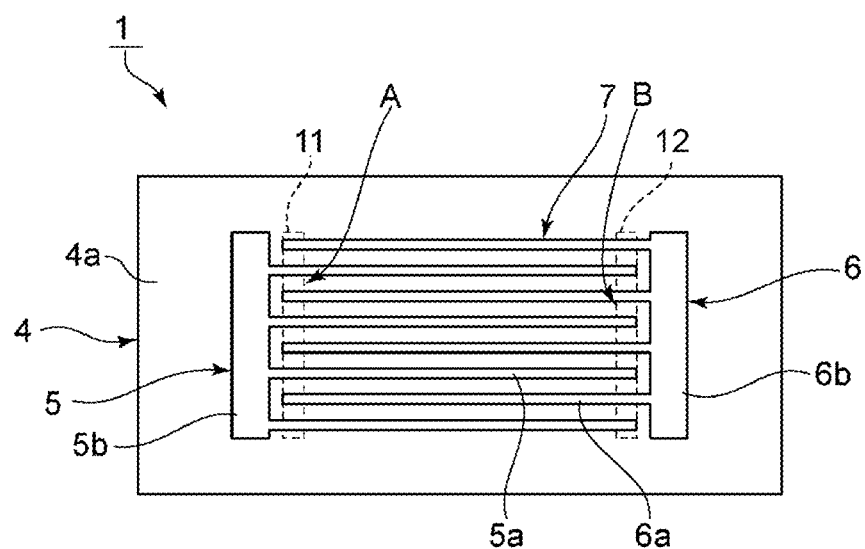
FIGS. 1A and 1B are a plan view and a front sectional view illustrating a main portion of an acoustic wave device according to a first preferred embodiment of the present invention.
Figure 1B:
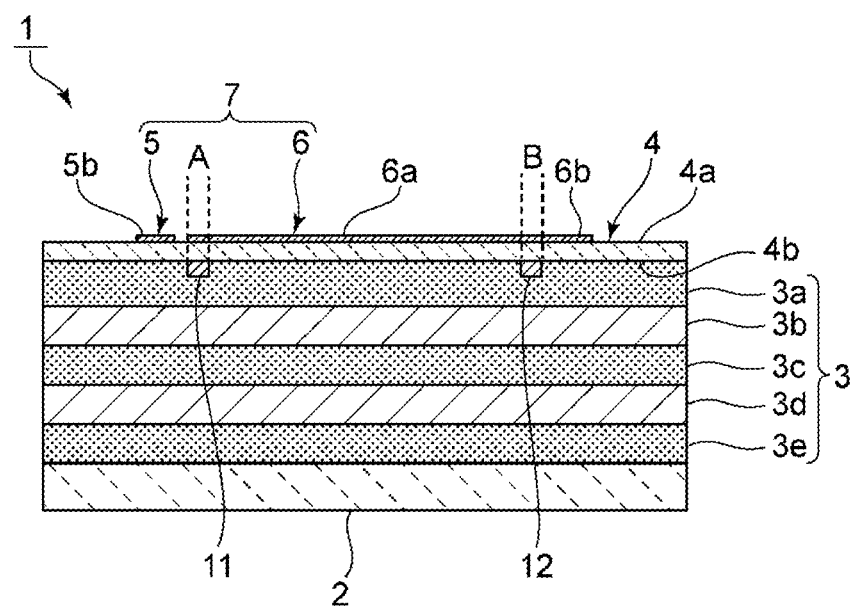
Figure 2:
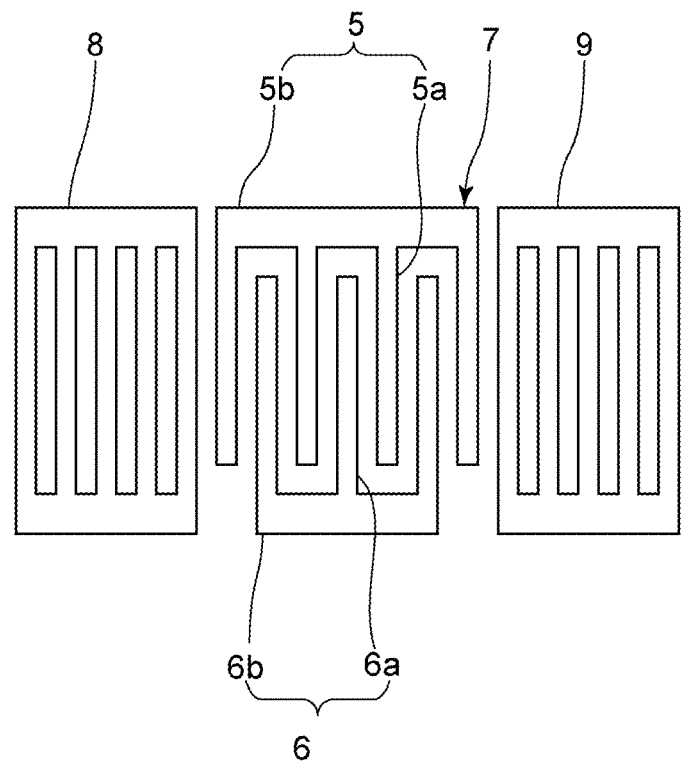
FIG. 2 is a plan view schematically illustrating an electrode structure of the acoustic wave device according to the first preferred embodiment of the present invention.

FIGS. 1A and 1B are a plan view and a front sectional view illustrating a main portion of an acoustic wave device according to a first preferred embodiment of the present invention, and FIG. 2 is a plan view schematically illustrating an electrode structure of the acoustic wave device according to the present preferred embodiment.

As illustrated in FIGS. 1A and 1B, an acoustic wave device 1 includes a support substrate 2. An energy confinement layer 3 is laminated on the support substrate 2. A piezoelectric film 4 is laminated on the energy confinement layer 3. The piezoelectric film 4 includes a first main surface 4a and a second main surface 4b opposing each other. The piezoelectric film 4 is laminated on the energy confinement layer 3 such that the second main surface 4b is in contact with the energy confinement layer 3. An IDT electrode 7 is provided on the first main surface 4a of the piezoelectric film 4.

FIGS. 1A and 1B show a portion where the IDT electrode 7 is provided, but in actuality, reflectors 8 and 9 are provided on both sides of the IDT electrode 7 in an acoustic wave propagation direction as illustrated in FIG. 2. With this, an acoustic wave resonator is provided.

In the acoustic wave device 1, acoustic velocity adjustment films 11 and 12 are provided. The acoustic velocity adjustment films 11 and 12 are provided to adjust the acoustic velocity of a propagating acoustic wave. In the acoustic wave device 1 according to the present preferred embodiment, providing the acoustic velocity adjustment films 11 and 12 makes it possible to partially differentiate the acoustic velocity. Further, as will be described later, acoustic loss is unlikely to occur, and therefore, the deterioration of the electromechanical coupling coefficient and the Q characteristics is unlikely to occur. Hereinafter, the acoustic wave device 1 will be described in detail.

The support substrate 2 is made of an insulator, a semiconductor, or the like, for example. The materials above are not particularly limited, and examples thereof include Si and $Al_2O_3$. The energy confinement layer 3 includes low acoustic impedance layers 3a, 3c, and 3e having relatively low acoustic impedance and includes high acoustic impedance layers 3b and 3d having relatively high acoustic impedance. The low acoustic impedance layers 3a, 3c, and 3e and the high acoustic impedance layers 3b and 3d are alternately laminated.

Materials of the low acoustic impedance layers 3a, 3c, and 3e and materials of the high acoustic impedance layers 3b and 3d are not particularly limited as long as the above-described relationship in acoustic impedance is satisfied. Examples of the material of the low acoustic impedance layers 3a, 3c, and 3e include silicon oxide and silicon oxynitride. Examples of the material of the high acoustic impedance layers 3b and 3d include metals and dielectrics such as $Al_2O_3$.

The piezoelectric film 4 is laminated on an upper surface of the energy confinement layer 3. The piezoelectric film 4 may be made of a piezoelectric single crystal, such as $LiNbO_3$ or $LiTaO_3$, or piezoelectric ceramics. In the present preferred embodiment, $LiNbO_3$ is used.

The IDT electrode 7 includes a first comb-shaped electrode 5 and a second comb-shaped electrode 6. The first comb-shaped electrode 5 includes a plurality of first electrode fingers 5a and a first busbar 5b. The second comb-shaped electrode 6 includes a plurality of second electrode fingers 6a and a second busbar 6b. The plurality of first electrode fingers 5a and the plurality of second electrode fingers 6a are interdigitating with each other.

The IDT electrode 7 may be made of a metal such as, for example, Al, Cu, W, or Mo, or an alloy including any of these metals as a main component. Alternatively, a laminated metal film provided by laminating a plurality of metal films may be used. The material of the IDT electrode 7 is not particularly limited.

A wavelength determined by an electrode finger pitch in the IDT electrode 7 is denoted by $\lambda$. The thickness of the piezoelectric film 4 is preferably about $1.5\lambda$ or less, for example. When the piezoelectric film 4 is thin like this, a generated acoustic wave may effectively be confined in the piezoelectric film 4 using the energy confinement layer 3. In the energy confinement layer 3, it is sufficient that at least one of the low acoustic impedance layers 3a, 3c, and 3e is positioned closer to a side of the piezoelectric film 4 than at least one of the high acoustic impedance layers 3b and 3d. This makes it possible to reflect an acoustic wave and effectively confine the energy of the acoustic wave in the piezoelectric film 4.

The number of laminations of the low acoustic impedance layers and the high acoustic impedance layers in the energy confinement layer 3 is not particularly limited.

The acoustic velocity adjustment films 11 and 12 are disposed to provide a region in which acoustic velocities are different in an overlap width direction in the IDT electrode 7. In the IDT electrode 7, an overlap region is a region where the first electrode finger 5a and the second electrode finger 6a overlap with each other when viewed in the acoustic wave propagation direction. Acoustic waves are excited in the overlap region.

A central region is positioned in the center of the overlap region in a direction in which the first electrode finger 5a and the second electrode finger 6a extend. In the overlap region, the acoustic velocity adjustment films 11 and 12 make the acoustic velocity in the first edge region A and the second edge region B positioned on both sides of the central region lower than the acoustic velocity in the central region. That is, the regions in which the acoustic velocity adjustment films 11 and 12 are provided are the first edge region A and the second edge region B. The first edge region A and the second edge region B are regions having a rectangular or substantially rectangular shape extending in the acoustic wave propagation direction as illustrated in FIG. 1A. The acoustic velocity adjustment films 11 and 12 are provided in the first and second edge regions A and B.

The acoustic velocity adjustment films 11 and 12 are positioned on the upper surface of the energy confinement layer 3. The acoustic velocity adjustment films 11 and 12 may be formed by patterning on the energy confinement layer 3. Accordingly, the acoustic velocity adjustment films 11 and 12 may be formed with high accuracy, and this makes it possible to adjust the acoustic velocity with high accuracy. Further, since another film is not added on the first electrode finger 5a and the second electrode finger 6a, the deterioration of the electromechanical coupling coefficient and the Q characteristics due to acoustic loss is unlikely to occur. As a material of the acoustic velocity adjustment films 11 and 12, an appropriate material may be used. For example, a metal such as Au, Pt, Pd, Ta, Nb, or W, an alloy including any of these metals as a main component, an oxide of any of these metals, or the like may suitably be used. In the present preferred embodiment, the acoustic velocity in the first edge region A and the second edge region B may be lower than the acoustic velocity in the central region because of a mass addition effect provided by the acoustic velocity adjustment films 11 and 12. With this, ripples due to a transverse mode may be reduced or prevented.

In the present preferred embodiment, the acoustic velocity adjustment films 11 and 12 are provided in contact with the piezoelectric film 4 at an interface between the energy confinement layer 3 and the piezoelectric film 4. Accordingly, the acoustic velocity in the first edge region A and the second edge region B may be effectively reduced. The acoustic velocity adjustment films 11 and 12 may be laminated on the upper surface of the energy confinement layer 3. Alternatively, the acoustic velocity adjustment films 11 and 12 may be formed by patterning on the second main surface 4b of the piezoelectric film 4 and laminated on the support substrate 2 after the energy confinement layer 3 is provided therebetween. In any formation methods, the acoustic velocity adjustment films 11 and 12 may be formed by patterning on a flat surface. Accordingly, the acoustic velocity adjustment films 11 and 12 may be provided with high accuracy. An adhesion layer may be provided between the acoustic velocity adjustment films 11 and 12 and the piezoelectric film 4.

Figure 3:
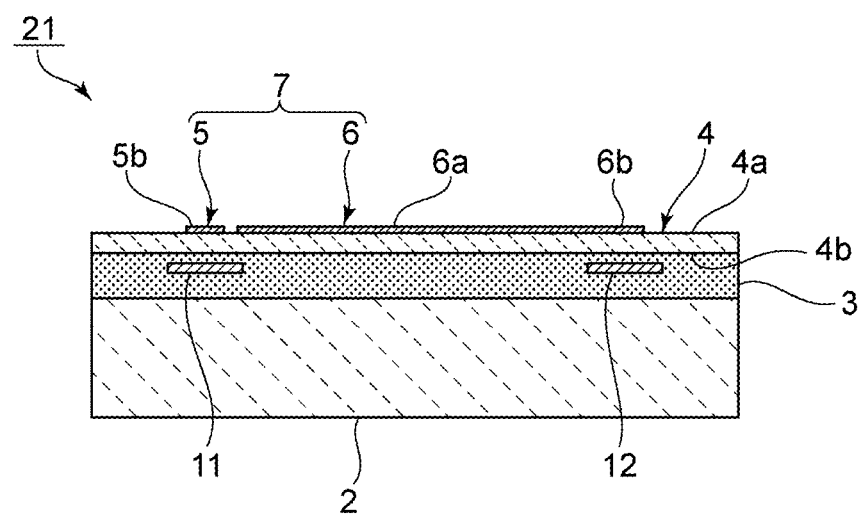
FIG. 3 is a front sectional view illustrating a main portion of an acoustic wave device according to a second preferred embodiment of the present invention.

FIG. 3 is a front sectional view illustrating a main portion of an acoustic wave device according to a second preferred embodiment of the present invention. In an acoustic wave device according to the second preferred embodiment, the acoustic velocity adjustment films 11 and 12 are provided in the energy confinement layer 3. The energy confinement layer 3 is schematically illustrated in FIG. 3 but, in actuality, is configured in the same or substantially the same manner as the energy confinement layer 3 of the first preferred embodiment. Accordingly, the plurality of high acoustic impedance layers and the plurality of low acoustic impedance layers are alternately laminated.

In the acoustic wave device 21 according to the second preferred embodiment, the acoustic velocity adjustment films 11 and 12 are provided in the energy confinement layer 3. That is, the acoustic velocity adjustment films 11 and 12 are not in direct contact with the second main surface 4b of the piezoelectric film 4. As described above, the acoustic velocity adjustment films 11 and 12 may be provided at any position between the second main surface 4b of the piezoelectric film 4 and the support substrate 2. However, it is more preferable that the acoustic velocity adjustment films 11 and 12 is provided at, for example, a position about ½λ to about 1λ spaced apart from the piezoelectric film 4.

In the acoustic wave device 21, the acoustic velocity adjustment films 11 and 12 are not positioned in the first edge region A and the second edge region B but are positioned below the portions where the first busbar 5b and the second busbar 6b are provided. As described above, in an acoustic wave device according to a preferred embodiment of the present invention, the acoustic velocity adjustment films 11 and 12 are not limited to differentiating the acoustic velocity in the first edge region A and the second edge region B, and the acoustic velocity adjustment films 11 and 12 may be provided in order to differentiate the acoustic velocity of other portions. Further, the acoustic velocity adjustment films 11 and 12 may be provided to increase the acoustic velocity. As the material, alumina, SiC, diamond, or the like may be used, for example.

Figure 4A:
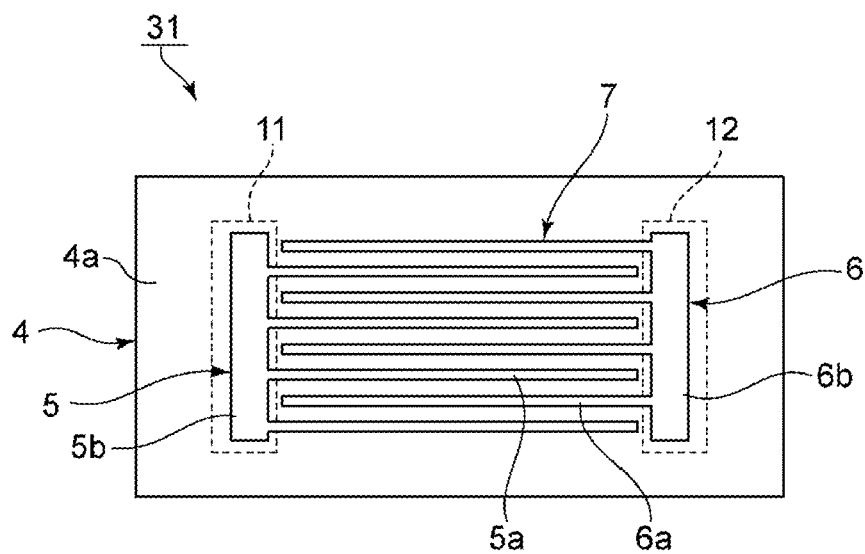
FIGS. 4A and 4B are a plan view and a front sectional view illustrating a main portion of an acoustic wave device according to a third preferred embodiment of the present invention.
Figure 4B:
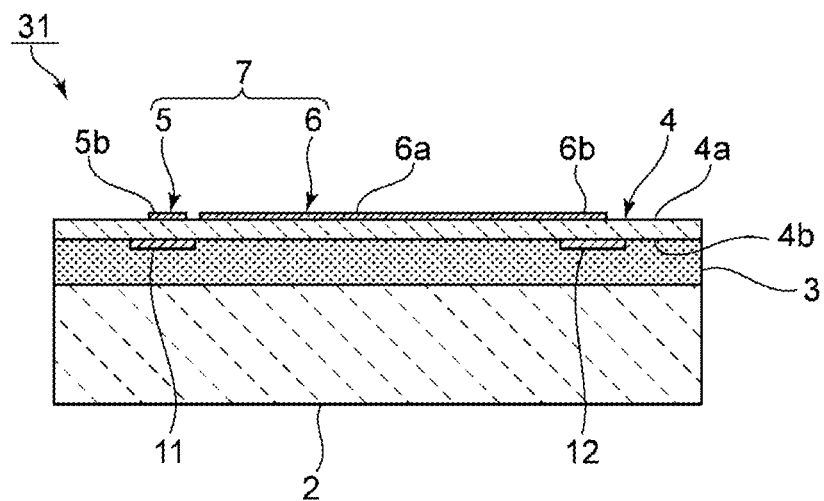

FIGS. 4A and 4B are a plan view and a front sectional view illustrating a main portion of an acoustic wave device 31 according to a third preferred embodiment of the present invention.

In the acoustic wave device 31, similarly to the acoustic wave device 21, the acoustic velocity adjustment films 11 and 12 are positioned below the first busbar 5b and the second busbar 6b. The acoustic velocity adjustment films 11 and 12 are in contact with the second main surface 4b of the piezoelectric film 4. As described above, the acoustic velocity adjustment films 11 and 12 may be provided in contact with the second main surface 4b of the piezoelectric film 4 also when the acoustic velocity of portions other than the first edge region A and the second edge region B is differentiated.

Figure 5A:
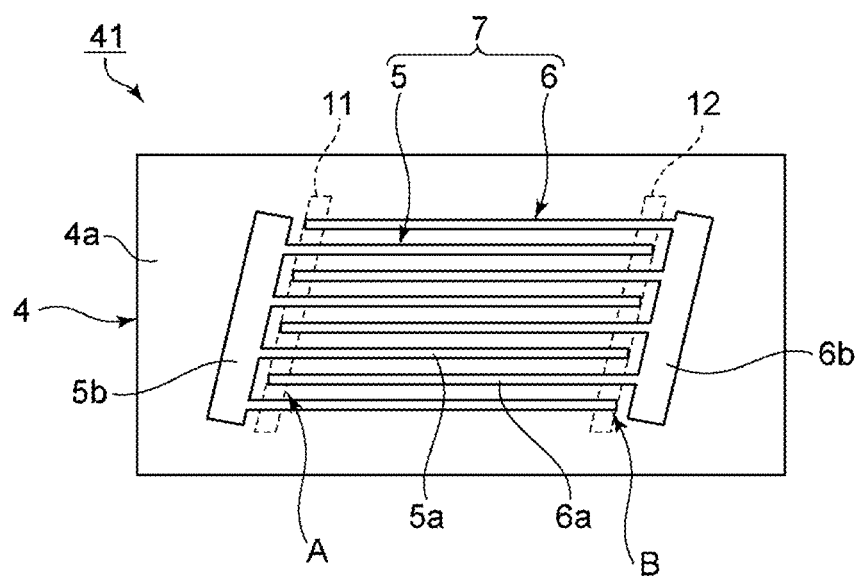
FIGS. 5A and 5B are a plan view and a front sectional view illustrating a main portion of an acoustic wave device according to a fourth preferred embodiment of the present invention.
Figure 5B:
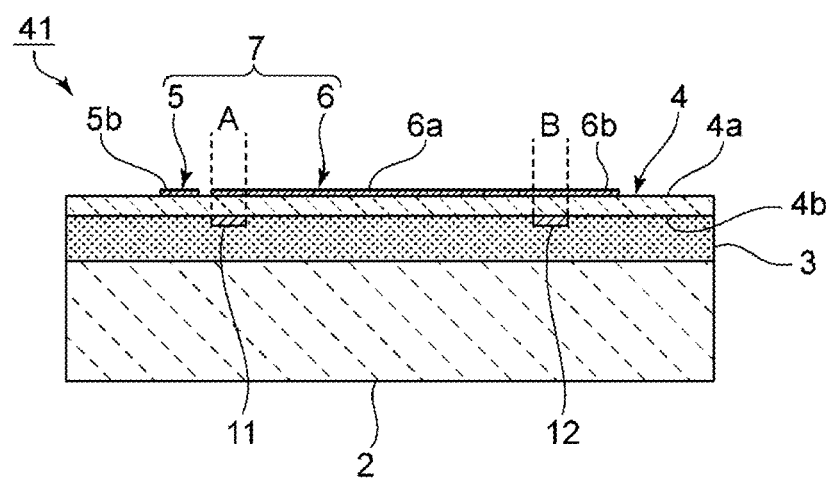

FIGS. 5A and 5B are a plan view and a front sectional view illustrating a main portion of an acoustic wave device 41 according to a fourth preferred embodiment of the present invention.

In the IDT electrode 7 of the acoustic wave device 41, an envelope connecting the tips of the first electrode fingers 5a and an envelope connecting the tips of the second electrode fingers 6a are not oriented in a direction orthogonal or substantially orthogonal to the first electrode finger 5a and the second electrode finger 6a but are inclined with respect to the direction orthogonal or substantially orthogonal to the first electrode finger 5a and the second electrode finger 6a. In addition, the extending directions of the first busbar 5b and the second busbar 6b are also inclined with respect to the acoustic wave propagation direction. Since the first edge region A and the second edge region B are inclined in the same or substantially the same manner, the acoustic velocity adjustment films 11 and 12 are also inclined with respect to the acoustic wave propagation direction in a plan view. As described above, the IDT electrode 7 may have a structure in which the first edge region A and the second edge region B are inclined with respect to the acoustic wave propagation direction.

Here, the IDT electrode 7 in the first preferred embodiment is a normal IDT electrode including no inclined structure. The acoustic wave device 41 according to the present preferred embodiment is configured in the same or substantially the same manner as the acoustic wave device 1 according to the first preferred embodiment, except for the inclined structure of the IDT electrode 7 above. Accordingly, the acoustic velocity may be adjusted with high accuracy with the acoustic velocity adjustment films 11 and 12, and the acoustic velocity in the first edge region A and the second edge region B may effectively be reduced.

Figure 6:
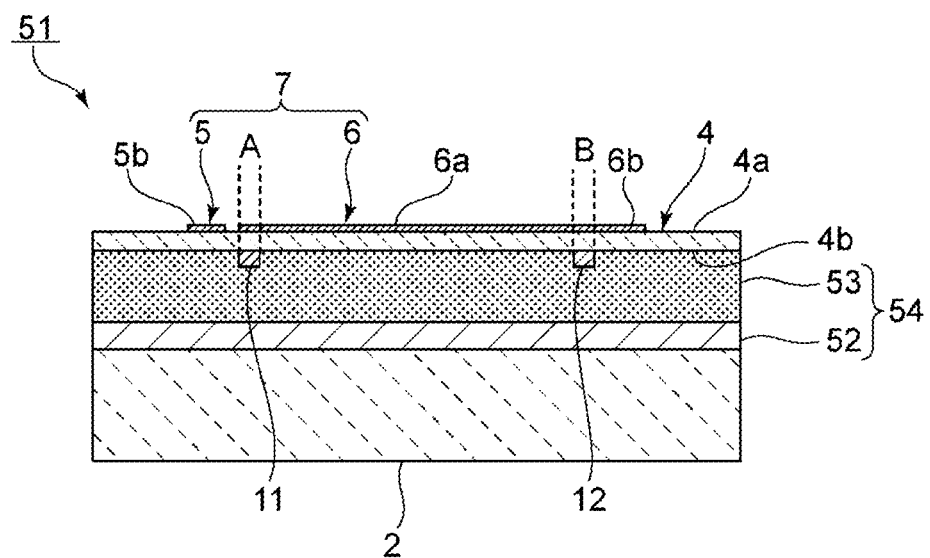
FIG. 6 is a front sectional view illustrating a main portion of an acoustic wave device according to a fifth preferred embodiment of the present invention.

FIG. 6 is a front sectional view illustrating a main portion of an acoustic wave device 51 according to a fifth preferred embodiment of the present invention. In the acoustic wave device 51, an energy confinement layer 54 includes a high acoustic velocity film 52 as a high acoustic velocity material layer and a low acoustic velocity film 53 as a low acoustic velocity material layer. The acoustic wave device 51 is configured in the same or substantially the same manner as the acoustic wave device 1, except that the energy confinement layer 54 is provided instead of the energy confinement layer 3.

For the high acoustic velocity film 52, a film made of a high acoustic velocity material in which the acoustic velocity of a bulk wave propagating therethrough is higher than the acoustic velocity of an acoustic wave propagating through the piezoelectric film 4 may be used. As the high acoustic velocity material described above, it is possible to use various high acoustic velocity materials such as, for example, aluminum nitride, aluminum oxide, silicon carbide, silicon oxynitride, a DLC film, diamond, and a medium containing the above-described material as a main component.

The low acoustic velocity film 53 is made of a low acoustic velocity material. The low acoustic velocity material is a material in which the acoustic velocity of a bulk wave propagating therethrough is lower than the acoustic velocity of a bulk wave propagating through the piezoelectric film 4. As the low acoustic velocity material described above, it is possible to use, for example, silicon oxide, glass, silicon oxynitride, tantalum oxide, a compound obtained by adding fluorine, carbon, or boron to silicon oxide, or a medium including the above-described material as a main component.

The low acoustic velocity film 53 and the high acoustic velocity film 52 may be repeatedly laminated. It is sufficient that at least one high acoustic velocity film 52 is positioned closer to a side of the support substrate 2 than at least one low acoustic velocity film 53. With this, the energy of the acoustic wave may be effectively confined in the piezoelectric film 4.

Accordingly, the high acoustic velocity film 52 may be integrally provided with the support substrate 2 made of a high acoustic velocity material. Also in this case, the low acoustic velocity film 53 and the piezoelectric film 4 are laminated on the high acoustic velocity member. Accordingly, the energy of the acoustic wave may be effectively confined in the piezoelectric film 4. Further, for example, the high acoustic velocity film 52 and the support substrate 2 may be integrally made of the same material.

Also in the acoustic wave device 51, since the acoustic velocity adjustment films 11 and 12 are provided below the first edge region A and the second edge region B, the acoustic velocity in the first edge region A and the second edge region B may be adjusted to be reduced. Moreover, as in the case of the first preferred embodiment, the acoustic velocity adjustment films 11 and 12 may be formed with high accuracy, and the deterioration of the electromechanical coupling coefficient and the characteristics due to acoustic loss is unlikely to occur.

Figure 7:
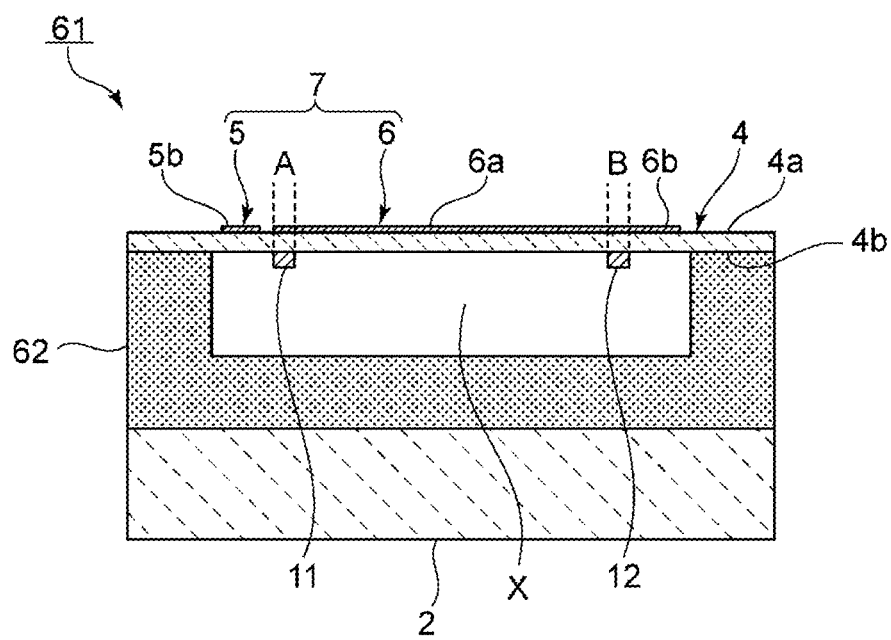
FIG. 7 is a front sectional view illustrating a main portion of an acoustic wave device according to a sixth preferred embodiment of the present invention.

FIG. 7 is a front sectional view illustrating a main portion of an acoustic wave device according to a sixth preferred embodiment of the present invention. In an acoustic wave device 61, a cavity X is provided in an intermediate layer 62 as an energy confinement layer. Here, the intermediate layer 62 is provided on the support substrate 2. In the intermediate layer 62, a recess open upward defines the cavity X. The piezoelectric film 4 is laminated on the intermediate layer 62 so as to cover the cavity X. The acoustic velocity adjustment films 11 and 12 are provided on the second main surface 4b of the piezoelectric film 4. The acoustic velocity adjustment films 11 and 12 are provided below the first edge region A and the second edge region B of the IDT electrode 7. Accordingly, also in the acoustic wave device 61 of the present preferred embodiment, the acoustic velocity in the first edge region A and the second edge region B may effectively be reduced.

In the present preferred embodiment, the energy confinement layer may be the cavity X described above. Thus, the energy of the acoustic wave may be effectively confined in the piezoelectric film 4.

In the present preferred embodiment, the piezoelectric film may be made of, for example, $LiNbO_3$ or $LiTaO_3$, and d/p is, for example, about 0.5 or less where d is a thickness of the piezoelectric film and p is a center-to-center distance between first and second electrode fingers 5a and 6a of the IDT electrode that are adjacent each other. More preferably, d/p is, for example, about 0.24 or less. Here, a thickness-slip-mode bulk wave may be utilized.

In the present preferred embodiment, a metallization ratio MR may satisfy MR≤1.75 (d/p)+0.075, for example. MR is a ratio of B) to A), where A) is an excitation region where the first electrode finger and the second electrode finger are overlapped when viewed in the direction that the first electrode finger and the second electrode finger are opposed to each other, and B) is a total area of the first electrode finger and the second electrode finger within the excitation region.

In the present preferred embodiment, Euler angles (φ, θ, ψ) of the $LiNbO_3$ or the $LiTaO_3$ may fall within the range of any of the following formula 1), 2), and 3).

$(0°±10°, 0°~20°, ψ)$      formula 1)

$(0°±10°, 20°~80°, 0°~60°(1-(θ-50)2/900)^{1/2}))$ or $(0°±10°, 20°~80°, [180°-60°(1-(θ-50)2/900)^{1/2}])$ ~180°)      formula 2)

$(0°±10°, [180°-30°(1-(ψ-90)2/8100)^{1/2}]~180°, ψ)$      formula 3)

Figure 8:
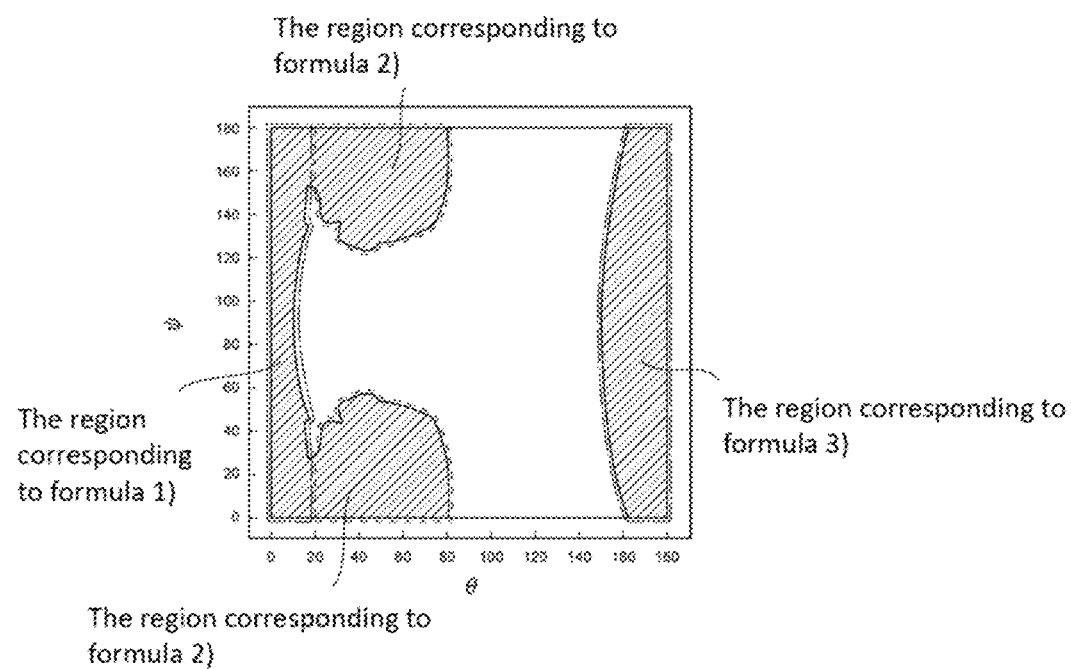
FIG. 8 is a graph showing Euler angles of a piezoelectric film made of $LiNbO_3$ or $LiTaO_3$ according to a preferred embodiment of the present invention.

In the present preferred embodiment, Euler angles (φ, θ, ψ) of the $LiNbO_3$ or the $LiTaO_3$ may be positioned within the region shown in FIG. 8.

Also in the acoustic wave device 61, the acoustic velocity adjustment films 11 and 12 may be provided on the second main surface 4b of the piezoelectric film 4. This makes it possible to form the acoustic velocity adjustment films 11 and 12 with high accuracy and to adjust the acoustic velocity with high accuracy. Further, since the acoustic loss in the acoustic velocity adjustment films 11 and 12 is unlikely to occur, the deterioration of the electromechanical coupling coefficient and the Q characteristics is unlikely to occur.

The material of the intermediate layer 62 is not limited to silicon oxide, and various dielectric materials may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric film;
   an IDT electrode on the piezoelectric film;
   an energy confinement layer between the piezoelectric film and the support substrate to confine energy in the piezoelectric film; and
   an acoustic velocity adjustment film at least partially between the piezoelectric film and the support substrate and made of a material different from a material of the piezoelectric film; wherein
   the IDT electrode includes first and second electrode fingers interdigitating with each other;
   when a region where the first electrode finger and the second electrode finger overlap with each other when viewed in an acoustic wave propagation direction is defined as an overlap region, the overlap region includes a central region at a center in a direction in which the first and second electrode fingers extend and an edge region on each side of the central region; and
   the acoustic velocity adjustment film is below only the edge region to extend in the acoustic wave propagation direction, and/or the acoustic velocity adjustment film does not overlap with the overlap region in a plan view.

2. The acoustic wave device according to claim 1, wherein the energy confinement layer includes, on a side of the piezoelectric film, a cavity positioned below a portion where the IDT electrode is provided.

3. The acoustic wave device according to claim 2, wherein the piezoelectric film is made of $LiNbO_3$ or $LiTaO_3$, and d/p is about 0.5 or less where d is a thickness of the piezoelectric film and p is a center-to-center distance between electrode fingers of the IDT electrode that are adjacent to each other.

4. The acoustic wave device according to claim 3, wherein Euler angles (φ, θ, ψ) of the $LiNbO_3$ or the $LiTaO_3$ fall within the range of any of the following formula 1), 2) and 3):

$(0°±10°, 0°~20°, ψ)$      formula 1);

$(0°±10°, 20°~80°, 0°~60°(1-(θ-50)^2/900)^{1/2}))$ or $(0°±10°, 20°~80°, [180°-60°(1-(θ-50)^2/900)^{1/2}])$ ~180°      formula 2); and $(0°±10°, [180°-30°(1-(ψ-90)^2/8100)^{1/2}]~180°, ψ)$      formula 3).

5. The acoustic wave device according to claim 4, wherein Euler angles (φ, θ, ψ) of the $LiNbO_3$ or the $LiTaO_3$ are positioned within at least one of the regions shown in FIG. 8.

6. The acoustic wave device according to claim 3, wherein d/p is 0.24 or less.

7. The acoustic wave device according to claim 3, wherein a metallization ratio MR satisfies MR≤1.75 (d/p)+0.075, MR being a ratio of B) to A), where A) is an excitation region where the first electrode finger and the second electrode finger are overlapped when viewed in a direction in which the first electrode finger and the second electrode finger are opposed to each other, and B) is a total area of the first electrode finger and the second electrode finger within the excitation region.

8. The acoustic wave device according to claim 2, wherein a recess including the cavity is provided in the energy confinement layer.

9. The acoustic wave device according to claim 1, wherein the energy confinement layer includes a low acoustic impedance layer having relatively low acoustic impedance, and a high acoustic impedance layer having relatively high acoustic impedance and positioned closer to a side of the support substrate than the low acoustic impedance layer.

10. The acoustic wave device according to claim 9, wherein a plurality of the low acoustic impedance layers and a plurality of the high acoustic impedance layers are alternately laminated.

11. The acoustic wave device according to claim 9, wherein the low acoustic impedance layer includes at least one of silicon oxide or silicon oxynitride.

12. The acoustic wave device according to claim 9, wherein the high acoustic impedance layer includes $Al_2O_3$.

13. The acoustic wave device according to claim 1, wherein the energy confinement layer includes a high acoustic velocity material layer in which an acoustic velocity of a bulk wave propagating through the high acoustic velocity material layer is higher than an acoustic velocity of an acoustic wave propagating through the piezoelectric film, and a low acoustic velocity material layer in which an acoustic velocity of a bulk wave propagating through the low acoustic velocity material layer is lower than an acoustic velocity of a bulk wave propagating through the piezoelectric film.

14. The acoustic wave device according to claim 13, wherein the support substrate is made of a high acoustic velocity material, and the high acoustic velocity material layer and the support substrate are integrally made of a same or substantially a same material.

15. The acoustic wave device according to claim 1, wherein the acoustic velocity adjustment film is in contact with the piezoelectric film.

16. The acoustic wave device according to claim 1, wherein the IDT electrode is a normal IDT electrode.

17. The acoustic wave device according to claim 1, wherein the support substrate at least one of Si or $Al_2O_3$.

18. The acoustic wave device according to claim 1, wherein the piezoelectric film includes $LiNbO_3$ or $LiTaO_3$.

19. The acoustic wave device according to claim 1, wherein the IDT electrode includes at least one of Al, Cu, W, or Mo, or an alloy including any of Al, Cu, W, or Mo as a main component.

\* \* \* \* \*